United States Patent [19]

Maeda et al.

[11] Patent Number: 5,281,295
[45] Date of Patent: Jan. 25, 1994

[54] SEMICONDUCTOR FABRICATION EQUIPMENT

[75] Inventors: Kazuo Maeda; Kouichi Ohira; Mitsuo Hirose, all of Tokyo, Japan

[73] Assignees: Semiconductor Process Laboratory Co., Ltd.; Canon Sales Co., Inc.; Alcan-Tech, Co. Inc., all of Japan

[21] Appl. No.: 937,879
[22] PCT Filed: Feb. 12, 1992
[86] PCT No.: PCT/JP92/00137
§ 371 Date: Oct. 20, 1992
§ 102(e) Date: Oct. 20, 1992
[87] PCT Pub. No.: WO92/15116
PCT Pub. Date: Sep. 3, 1992

[30] Foreign Application Priority Data
Feb. 20, 1991 [JP] Japan ................. 3-26293

[51] Int. Cl.⁵ ............ B44C 1/22; C03C 15/00; C23C 16/00
[52] U.S. Cl. .............. 156/345; 118/719; 118/730; 156/643
[58] Field of Search ........... 156/345, 643, 646; 118/715, 719, 730, 50, 50.1, 620

[56] References Cited
U.S. PATENT DOCUMENTS 4,715,921 12/1987 Maher et al. ............ 156/345
5,013,385 5/1991 Maher et al. ............ 156/345
5,133,284 7/1992 Thomas et al. .......... 118/719
5,183,510 2/1993 Kimura .................. 118/719

FOREIGN PATENT DOCUMENTS 51-76976 7/1976 Japan.
64-47872 2/1989 Japan.
4-137613 5/1992 Japan.
4-145623 5/1992 Japan.
4-180226 6/1992 Japan.

Primary Examiner—William A. Powell
Attorney, Agent, or Firm—Lorusso & Loud

[57] ABSTRACT

A semiconductor fabrication apparatus includes a plurality of processing stations for film formation or etching, concurrently or continuously. The semiconductor fabrication apparatus is capable of supplying a process gas for film formation or etching from a single gas header to each processing station and provides uniform wafer processing at each processing station. The apparatus includes a process gas supply source; a plurality of branch pipes branched from the common header which, in turn, is connected to a process gas supply source; a plurality of outlet pipes connecting the branch pipes with the processing stations through first flow rate controllers; exhaust pipes also connected to the branch pipes; plural switching valves for switching the flow of process gas between the outlet pipes and the exhaust pipes; and plural second flow rate controllers in the exhaust pipes.

5 Claims, 5 Drawing Sheets

SEMICONDUCTOR FABRICATION EQUIPMENT

TECHNICAL FIELD

The present invention relates to semiconductor fabrication system including a plurality of processing stations for film formation and etching, concurrently or continuously.

BACKGROUND ART

Conventionally, as shown in FIG. 5, in formation of insulating films or conductive films on wafers using CVD equipment and RIE (Reactive Ion Etching) equipment in a plurality of processing stations, such as multiple chambers, a processing gas is uniformly supplied to gas dispersing devices $2a$ to $2e$ respectively provided at the processing stations for equalized film formation rates, etching rates and the like in the respective processing stations. Specifically, processing gas supply sources $1a$ to $1e$ are respectively provided for the gas dispersing devices $2a$ to $2e$, and sets of automatic flow rate controllers (AFC) $3a/4a/5a/6a$ to $3e/4e/5e/6e$ for automatically controlling the supply amounts of the processing gases are respectively provided for the processing gas supply sources $1a$ to $1e$.

However, if the number of the gas dispersing devices $2a$ to $2e$ is increased, the number of processing gas supply sources $1a$ to $1e$, the AFCs $3a/4a/5a/6a$ to $3e/4e/5e/6e$ and the like must be increased to a number corresponding to the number of the gas dispersing devices $2a$ to $2e$, and consequently, the above construction has the disadvantages of increasing the cost and of complicating the maintenance of the equipment.

In analyzing the above problem, it may be considered that the processing gas supply sources $1a$ to $1e$ are united and also that the processing gas is branched into the gas dispersing devices $2a$ to $2e$; however, since the conductances of respective branch pipings including the gas dispersing devices $2a$ to $2e$ are usually different from each other, it is difficult to uniformly supply the processing gas into each of the gas dispersing devices $2a$ to $2e$. Also, even if the conductances of the branch pipings including the gas dispersing devices $2a$ to $2e$ are similar to each other, in the case of continuously executing the processing, it often occurs at the initial and final stages that the processing gas is supplied only to a portion of the gas dispersing devices and the supply of the processing gas to the remaining portion of the gas dispersing devices is stopped, which also affects the total amount of the processing gas to the gas dispersing devices. Namely, in the above case, the total amount of the processing gas will fluctuate more than where the processing gas is supplied to all of the gas dispersing devices $2a$ to $2e$. Therefore, the film formation rate and the like are changed, thereby making it impossible to maintain uniformity of the thickness of the formed film.

Taking the above problems into consideration, the present invention has as its object provision of a semiconductor fabrication system capable of supplying equal amounts of a processing gas, for film formation or etching, from one gas supply source to the various processing stations, and thereby achieve uniform wafer processing at each processing station.

SUMMARY OF THE INVENTION

In a first aspect of the present invention, there is provided a semiconductor fabrication apparatus including a plurality of processing stations, e.g. chambers, each station including a processing gas introducing port for processing wafers by contact with a processing gas; a processing gas supply source for supplying the processing gas; a common header connected to the process gas supply source for carrying the processing gas; a plurality of branch pipes branched from the common header to the plurality of the processing stations; outlet pipes, each having one end connected to the branch pipes and the other end connected to the gas introducing port; and a plurality of first flow rate control means respectively provided on the introducing ports for controlling the flow rates of the processing gas. Accordingly, a single processing gas supply source is provided, and a plurality of the branch pipes and outlet pipes are provided corresponding to a plurality of processing stations. Further, the plural first flow rate control means are respectively provided on the outlet pipes. Accordingly, even when the gas flow conductances of the individual pipes and their respective processing stations are different, by controlling the flow rates of the processing gas with the first flow rate control means (for example, flow control orifices or needle valves), it is possible to equalize the gas flow rates, and hence to provide equal amounts (equal flow rates) of the processing gas to the various processing stations.

In a second aspect of the present invention, there is provided a semiconductor fabrication apparatus including exhaust pipes respectively connected to the branch pipes in parallel with the outlet pipes; plural switching means, each alternatively switching the gas flow through a branch pipe between an outlet pipe and an exhaust pipe; and plural second flow rate control means respectively provided on the exhaust pipes for controlling the flow rates of the processing gas therethrough.

In a third aspect of the present invention, at least one of the first flow rate control means and the second flow rate control means is a needle valve.

In a fourth aspect of the present invention, at least one of the first flow rate control means and the second flow rate control means is a flow control orifice for controlling the flow rate by constricting the gas flow capacity of the piping.

In a fifth aspect of the present invention, at least one of the first flow rate control means and the second flow rate control means includes both a flow control orifice and a needle valve.

Summarizing, exhaust pipes are connected to the branch pipes in parallel with the respective outlet pipes; switching means alternatively switch the gas flow received from the branch pipes between an outlet pipe and an exhaust pipe; and first and second flow rate control means (for example, flow control orifices or needle valves) are respectively provided on the outlet pipes and the exhaust pipes. Accordingly, it is possible to almost equalize the gas flows through the outlet pipes and processing stations with the gas flows through the exhaust pipes. In other words, for each branch pipe, the flow rate of the reaction gas through the connected outlet pipe is almost equal to that through the connected exhaust pipe, whereby switching between an exhaust pipe and an outlet pipe does not affect the flow rates of the processing gas in the other branch pipes. Consequently, even when the processing gas is supplied to only a portion of the processing stations, with the supply of the processing gas to the remaining portions of the processing stations stopped, it is possible to maintain a uniform supply of processing gas to the processing stations without any fluctuation by switching between the outlet pipe and the exhaust pipe connected to a given branch pipe. Therefore, it is possible to form a film having an uniform thickness and execute the etching to a proper extent while maintaining a uniform film formation rate or etching rate.

BEST MODE FOR CARRYING OUT THE INVENTION

Figure 1:
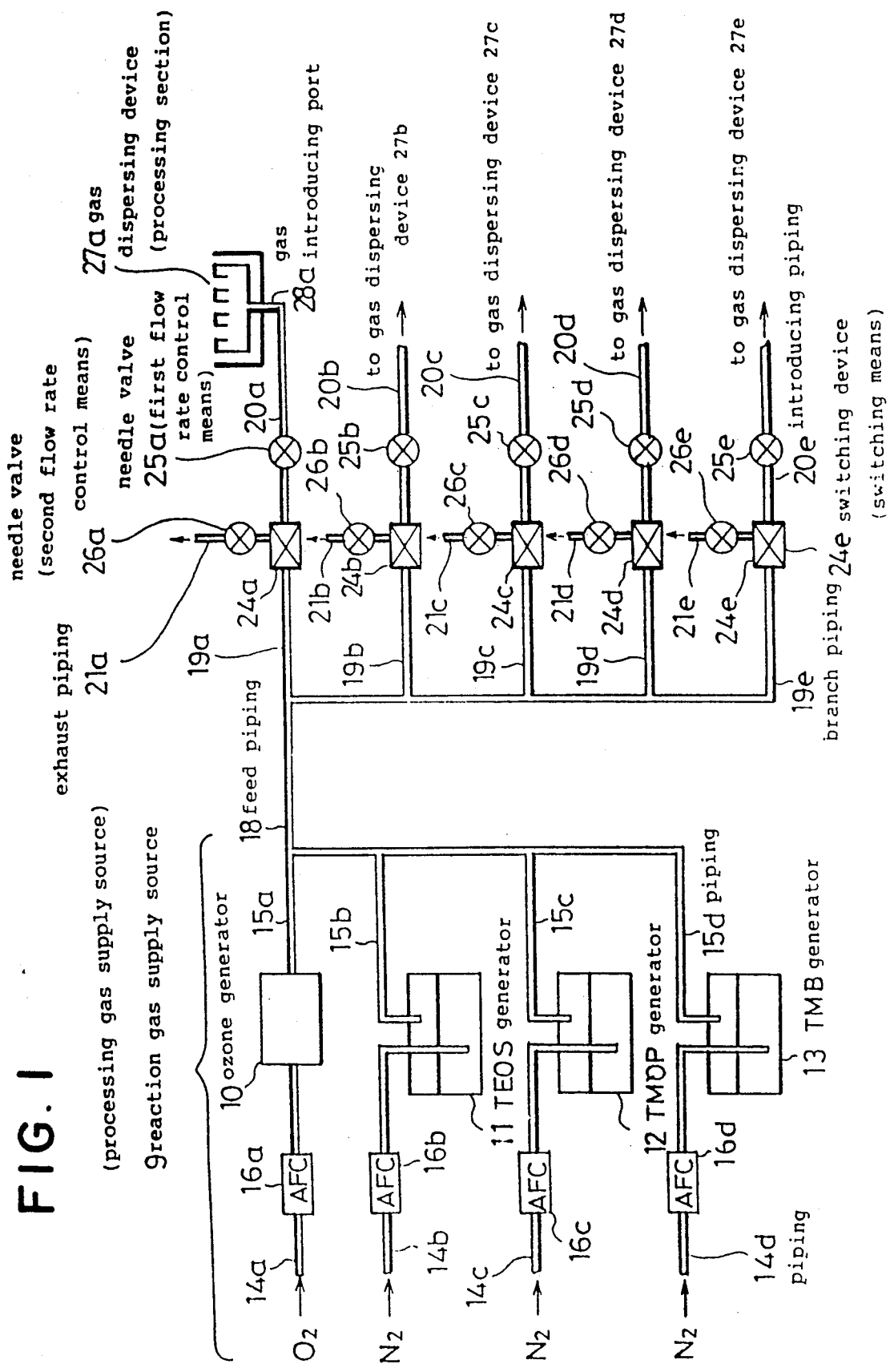
FIG. 1 is a schematic diagram of a CVD reaction gas supply apparatus according to one embodiment of the present invention.

An embodiment of the present invention will be described with reference to the accompanying drawings. FIG. 1 is a view showing a gas supply system for a CVD apparatus according to one embodiment of the present invention, which is adapted to form, for example, a B-PSG film.

In FIG. 1, 9 is an unitary reaction gas supply source (processing gas supply source). In the reaction gas supply source 9, an ozone generator 10, a TEOS (Tri-Etyl-Ortho-Silicate) generator 11, a TMOP (Tri-Methyl-Ortho-Phosphate) generator 12, and a TMB (Tri-Metyl-Borate) generator 13 generate an ozone gas, a nitrogen gas containing the TEOS, a nitrogen gas containing the TMOP, and a nitrogen gas containing the TMB fed to supply pipes 15a to 15d, respectively. The supply pipes 15a to 15d all feed into a common header 18 for producing a mixed gas. Also, automatic flow rate controllers (AFC) 16a to 16d are provided on inlet pipes 14a to 14d connected to the inlet sides of the ozone generator 10, the TEOS generator 11, the TMOP generator 12 and the TMB generator 13, respectively, which makes it possible to control the flow rates of the oxygen (O₂) and nitrogen carrier gases. Also, numerals 19a to 19e are branch pipes branched from the common header 18 and corresponding in number to five gas dispersing devices 27a to 27e, respectively; 24a to 24e are switching devices (switching means) connected to branch pipes 19a to 19e for controlling the reaction gas fed through the branch pipes 19a to 19e, respectively; 20a to 20e are outlet pipes for connecting the switching devices 24a to 24e to gas dispersing devices 27a to 27e, respectively; and 21a to 21e are exhaust pipes for connecting the switching devices 24a to 24e to exhaust stations (not shown), respectively. Accordingly, the outlet pipes 20a to 20e and the exhaust pipes 21a to 21e are connected to the outlet sides of the switching devices 24a to 24e so as to be in parallel with each other. Further, 25a to 25e are needle valves (first flow rate control means) provided on the outlet pipes 20a to 20e, respectively, and 26a to 26e are needle valves (second flow rate control means) provided on the exhaust pipes 21a to 21e for independently controlling the flow rates in the outlet pipes 20a to 20e and exhaust pipes 21a to 21e.

Numerals 27a to 27e are gas dispersing devices. The reaction gas is released from each of the gas dispersing devices 27a and 27e for forming a B-PSG film on the surfaces of a wafer.

As described above, in the CVD apparatus of this embodiment of the present invention, the reaction gas supply sources are united and five of the branch pipes 19a to 19e/outlet pipes 20a to 20e are provided so as to correspond to five of the gas dispersing devices 27a to 27e. The outlet pipes 20a to 20e are provided with the needle valves 25a to 25e, respectively.

Accordingly, even when the gas flow capacities of the branch pipes 19a to 19e/outlet pipes 20a to 20e including the gas dispersing devices 27a to 27e are different from each other at the time of installation thereof, it is possible to equalize the flow rates of the reaction gas with the needle valves 25a to 25e. Therefore, it is possible to uniformly supply the reaction gas to each of the gas dispersing devices 27a to 27e.

Also, the exhaust pies 21a to 21e are connected to the branch pipes 19a to 19e in parallel with the outlet pipes 20a to 20e, respectively. The outlet pipes 20a to 20e and the exhaust pipes 21a to 21e are provided with the needle valves 25a to 25e and the needle valves 26a to 26e, respectively. Accordingly, it is possible to control the gas flows through the outlet pipes 20a to 20e, including the gas dispersing devices 27a to 27e, to be almost equal to the gas flows through the exhaust pipes 21a to 21e, respectively. Thus, for each branch pipe 19a to 19e, the flow rates of the processing gas flowing in the connected outlet pipe and the exhaust pipe 20a/21a . . . , 20e/21e corresponding thereto are almost equal to each other. Thus, the switching between the outlet pipe and the exhaust pipe 20a/21a . . . , or 20e/21e in any branch pipe 19a . . . or 19e exerts no effect on the flow rate in the other branch pipes 19a, . . . , or 19e. Consequently, even when the processing gas is supplied to either gas dispersing device 27a, . . . , or 27e and the supply of the processing gas to the other gas dispersing device 27a, . . . , or 27e is stopped, by the switching from the outlet pipe to the exhaust pipe 20a/21a, . . . , or 20e/21e in the branch piping 19a, . . . , or 19e to which the supply of the processing gas is stopped, it is possible to supply the processing gas to the gas dispersing device 27a, . . . , or 27e without any fluctuation of the supply amount. This makes is possible to uniformly maintain the film formation rate over all the processing stations and to form a uniform film at each processing station.

In this embodiment, the present invention has been applied as a supply apparatus for reaction gas to CVD equipment; however, it may be applied as a supply apparatus for supplying an etching gas to etching apparatus, for example, an RIE etching apparatus.

The foregoing embodiment employs the needle valves 25a to 25e and the needle valves 26a to 26e as the first and second flow rate control means, respectively; however, there may be used flow control orifices or the like capable of controlling the flow rates by adjusting the gas flow capacity of the pipings.

Next, there will be described the formation of B-PSG films on wafers using a continuous CVD apparatus including the process gas supply apparatus according to the foregoing embodiment of the present invention, with reference to FIGS. 1 to 4.

Figure 2A:
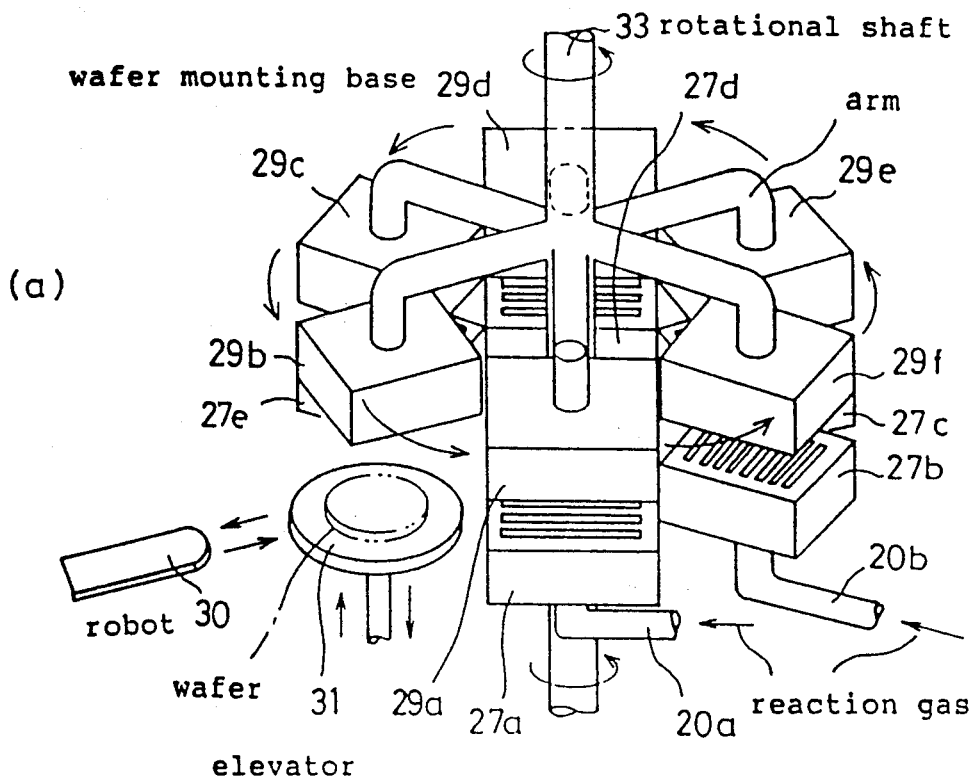
FIG. 2a and 2b are perspective views of a continuous CVD apparatus used in conjunction with the embodiment of FIG. 1.
Figure 2B:
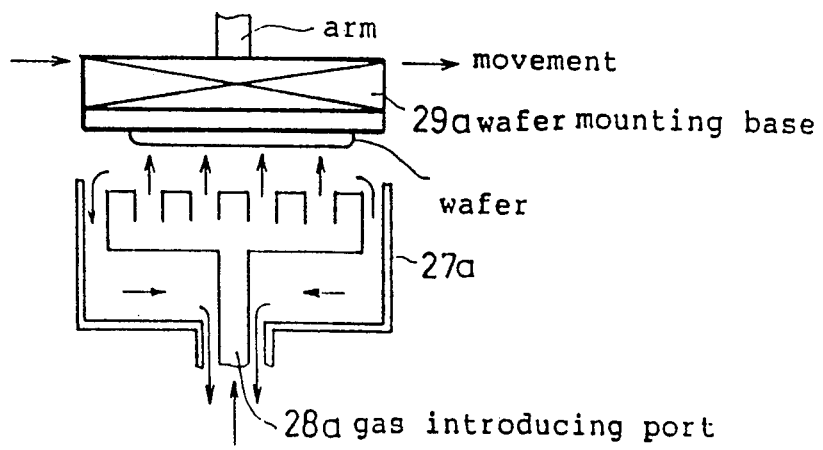
Figure 3A:
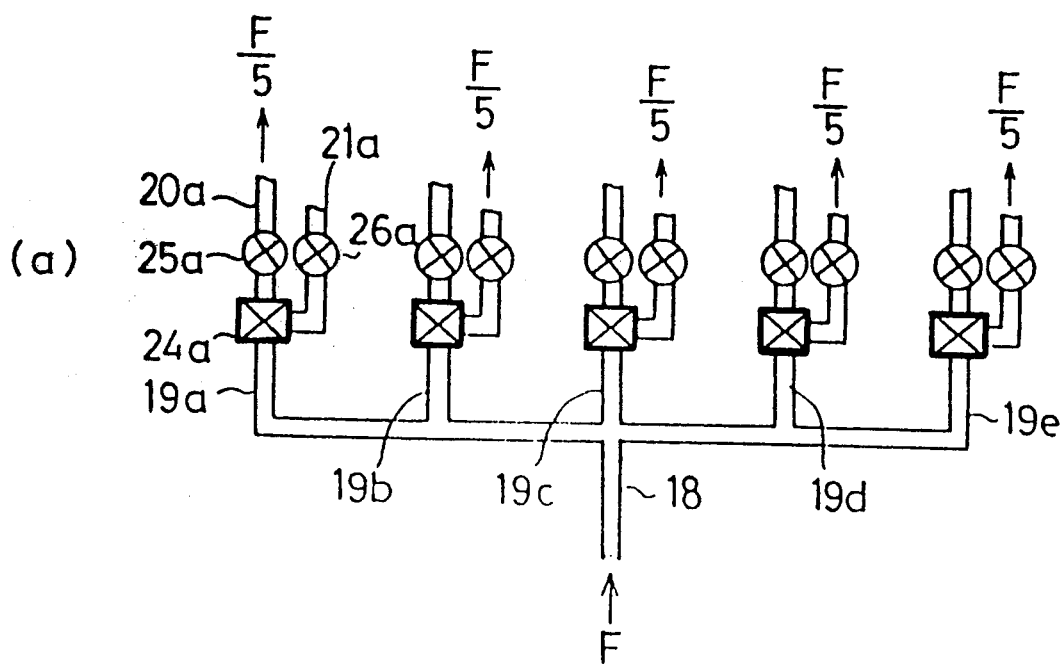
FIGS. 3a and 3b are views illustrating the alternative flow paths (a & b) of reaction gas in the reaction gas supply apparatus of FIG. 1.
Figure 3B:
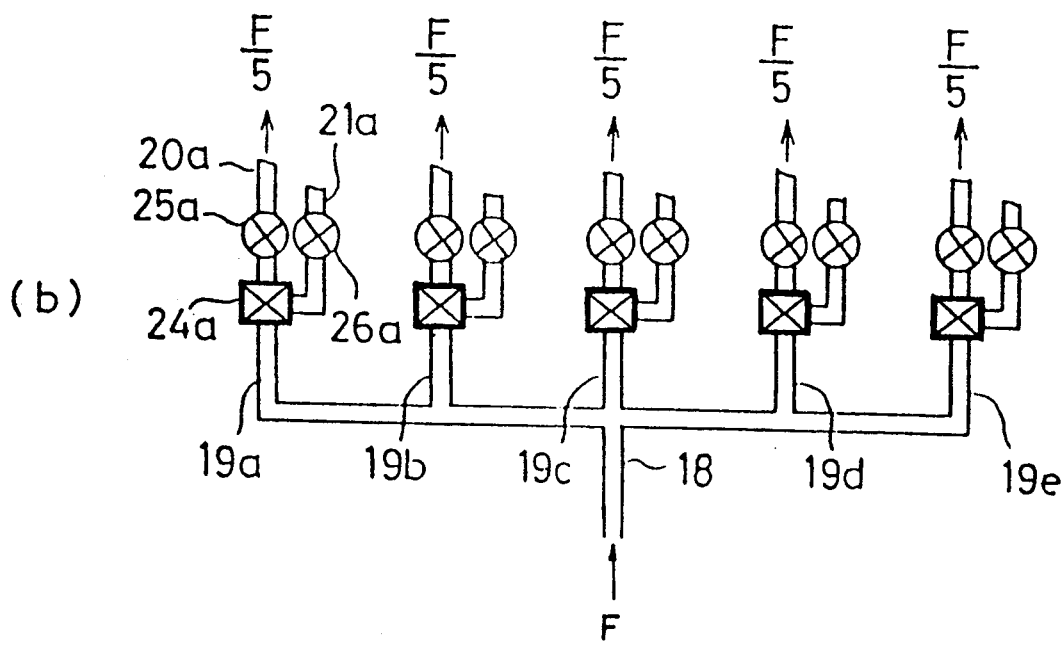
Figure 4:
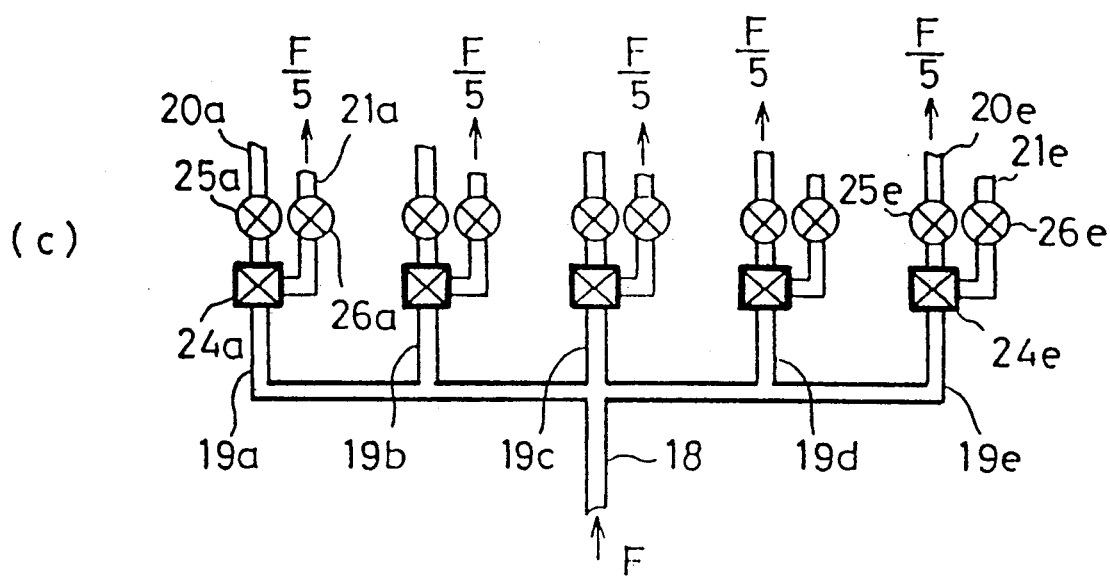
FIG. 4 is a view illustrating the next flow path (c) in sequence following those shown in FIGS. 3a and 3b.
Figure 5:
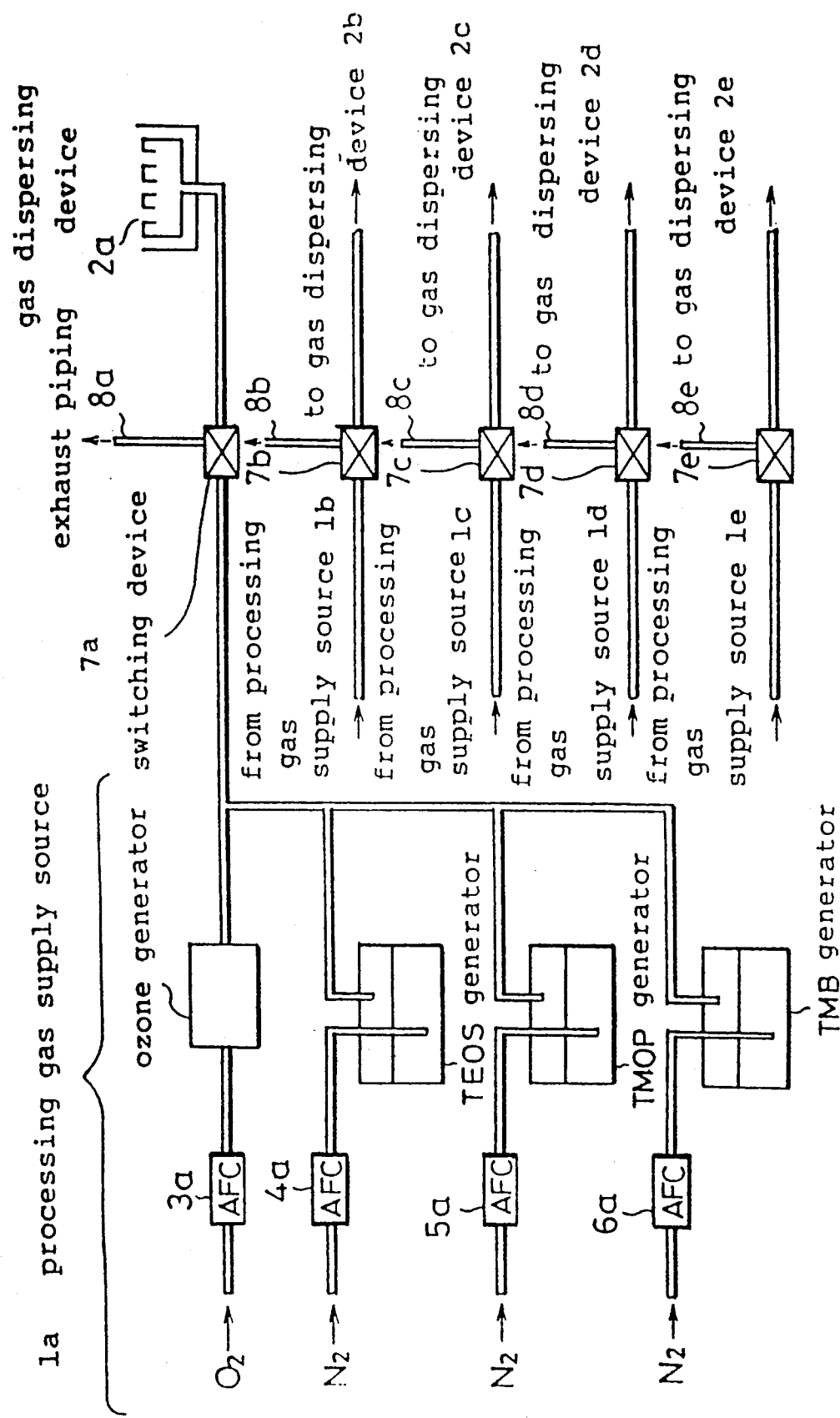
FIG. 5 is a schematic view showing a CVD apparatus including a conventional reaction gas supply apparatus.

FIG. 2a is a view showing the overall construction of the continuous CVD equipment having a plurality of the gas dispersing devices/wafer mounting bases; FIG. 2b is a view showing the details of one of the gas dispersing devices/wafer mounting bases; and FIGS. 3a and 3b, and FIG. 4c are views showing flows of the reaction gas in each process.

In FIG. 2a, 27a to 27e are five gas dispersing devices connected to pipes 20a to 20e through gas introducing ports 28a to 28e for releasing the reaction gas upwardly; 31 is a vertically movable pedestal for moving a wafer 32 transferred from a robot 30 to each of wafer mounting bases 29a to 29f, which are fixed around an rotational shaft 33 together with the gas dispersing devices 27a to 27e; 29a to 29e are six wafer mounting bases for mounting the wafers on their lower surfaces and are rotatably supported by the rotational shaft 33. The wafers are thereby held facing the gas releasing surfaces of the gas dispersing devices 27a to 27e respectively. FIG. 2b shows a state where the wafer mounting bases 29a to 29e are respectively positioned facing the gas dispersing devices 27a to 27e (except for the wafer mounting base 29b facing the pedestal 31), and, in particular, shows the details of one gas dispersing device 27a and one wafer mounting base 29a. In the above-described continuous CVD apparatus, for example. a B-PSG film having the target thickness is formed during one complete revolution.

First, the wafer is transferred to and mounted on the pedestal 31. Subsequently, the pedestal 31 is moved upwardly to mount the wafer on the wafer mounting base 27a. After that, the rotational shaft 33 is rotated, and is stopped at a position where the wafer mounting base 29a is positioned facing the gas dispersing device 27a. In addition, the wafer is preheated to a specified temperature by heaters (not shown) respectively provided on the wafer mounting bases 29a to 29e (see FIGS. 2a and 2b).

Next, as shown in FIG. 1, the reaction gas is allowed to flow through the exhaust pipes 21a to 21e by the switching devices 24a to 24e. Subsequently, $O_2$ and $N_2$ gases, which are respectively controlled in their flow rates by the AFCs 16a to 16e, are fed to the ozone generator 10, the TEOS generator 11, the TMOP generator 12 and the TMB generator 13 respectively, and consequently, the ozone, $N_2$ gas containing the TEOS, $N_2$ gas containing the TMOP and $N_2$ gas containing the TMB are fed to the pipes 15a to 15d respectively, and are led to the common header 18 which unites 15a to 15e. Thus, the ozone, $N_2$ gas containing the TEOS, $N_2$ gas containing the TMOP and $N_2$ gas containing the TMB are mixed, to produce the necessary reaction gas (Flow rate: F). The reaction gas is divided into equal flow portions (F/5), which flow through the branch pipes 19a to 19e and the exhaust pipes 21a to 21e.

Next, as shown in FIG. 3a, the switching device 24a is switched to stop the flow of the reaction gas flowing in the exhaust pipe 21a, thereby allowing the reaction gas to flow through outlet pipe 20a. The reaction gas is thereby supplied only to the gas dispersing device 27a for processing the wafer. Meanwhile, the needle valves 26a to 26e are adjusted so that flow through the exhaust pipes 21b will be equal to the flow through outlet pipe 20a, inclusive of the gas dispersing device 27a. Accordingly, fluctuation of the flow rate (F/5) of the reaction gas due to the switching of the switching device 24a is eliminated. By maintaining such a state for a specified period of time, a film 1/5 of the target thickness of the B-PSG film is formed on the wafer.

In addition, during formation of the film, as shown in FIG. 2a, the next wafer is mounted on the wafer mounting base 29b in the same manner as above, and is heated.

Next, by switching the switching device 24a, the flow of the reaction gas through outlet pipe 20a is stopped and the reaction gas is allowed to flow through the exhaust pipe 21a. After that, the rotational shaft 33 is rotated, and is stopped when the wafer mounting bases 29a and 29b are respectively positioned facing the gas dispersing devices 27b and 27a.

Subsequently, the switching devices 24a and 24b are switched to stop the flow of the reaction gas through the exhaust pipes 21a and 21b, and the reaction gas is allowed to flow through outlet pies 20a and 20b. By maintaining such a state for a specified period of time, 2/5 of the total target thickness of the B-PSG film is formed on the first wafer, and a film 1/5 the total target thickness is formed on the next wafer.

Additional wafers are sequentially mounted on the wafer mounting bases 29c to 29f, and B-PSG films are formed thereon. FIG. 3b shows the state wherein wafers are mounted on all of the wafer mounting bases 29a to 29f, and the B-PSG films are simultaneously formed on the wafers.

Next, as shown in FIG. 4c, it is assumed that, immediately before the processing of one lot of the wafers is completed, wafers remain only on the two wafer mounting bases 29e and 29f. In order to form the B-PSG films on these remaining wafers, the switching devices 24d and 24e are switched to stop the flow of the reaction gas through exhaust pipes 21d and 21e, and the reaction gas is allowed to flow through outlet pipes 20d and 20e. The reaction gas is thereby supplied only to the gas dispersing devices 27d and 27e for the processing of the wafers. At this time, since the gas flow conductances of the exhaust pipes 21a to 21c are equalized with those of the outlet pies 21d to 21e, inclusive of the gas dispersing devices 27d and 27e, by the needle valves 26a to 26c provided on the exhaust pipes 26a to 26c, the flow rate (F/5) of the reaction gas is never changed by switching the switching devices 24d and 24e. By keeping such a state for a specified period of time, B-PSG films, each having the target thickness, are uniformly formed on both the remaining wafers.

Subsequently, after removing the wafer from the wafer mounting base 29e, the B-PSG film is formed on the last wafer remaining on the wafer mounting base 29f in the same manner as above. Thereafter, the wafer is removed, and thus the processes are all completed.

As described above, with the CVD apparatus of the present invention, it is possible to control the conductances (gas flow capacities) of the outlet pies 20a to 20e, inclusive of the gas dispersing devices 27a to 27e, to be equal to those of the exhaust pipes 21a to 21e. Thus, in the method for forming the B-PSG films using this CVD apparatus, for example, as shown in FIG. 3a, even when the reaction gas is supplied to only one gas dispersing device 27a, and the supply thereof to the other gas dispersing devices 27b to 27e is stopped, it is possible to uniformly maintain the amount of the reaction gas supplied to the gas dispersing device 27a without any fluctuation by executing the switching in the gas piping between the exhaust pipe 21a and the outlet pipe 20a. Therefore, is possible to uniformly form the film while keeping the film formation rate constant.

We claim:

1. A semiconductor fabrication apparatus comprising:
   a plurality of processing stations, each of said stations including a process gas outlet for contacting a wafer with a process gas;

plural process gas supply sources for supplying different process gases to the outlets;

a common header connected to said process gas supply sources for receiving process gas from all of the process gas sources;

a plurality of branch pipes, corresponding in number to said plural processing stations, branched from said common header;

outlet pipes, each having one end connected one of said branch pipes and the other end connected to one of the process gas outlets; and plural first flow rate control means, each associated with one of the process gas outlets, for controlling the flow rates of the process gas through the process gas outlets.

2. The semiconductor fabrication apparatus of claim 1, further comprising:

exhaust pipes, each exhaust pipe being connected to one of said branch pipes in parallel with one of said outlet pipes;

plural switching means for alternatively switching the process gas received through said branch pipes between said outlet pipes and said exhaust pipes; and plural second flow rate control means respectively provided on said exhaust pipes for controlling the flow rates of said process gas.

3. The semiconductor fabrication apparatus of claim 2, wherein at least one of said first flow rate control means and said second flow rate control means is a needle valve.

4. The semiconductor fabrication apparatus of claim 2, wherein at least one of said first flow rate control means and said second flow rate control means is a flow control orifice.

5. The semiconductor fabrication apparatus of claim 2, wherein at least one of said first flow rate control means and said second flow rate control means includes both a flow control orifice and a needle valve.

* * * * *

UNITED STATES PATENT AND TRADEMARK OFFICE
CERTIFICATE OF CORRECTION

PATENT NO. : 5,281,295
DATED : January 25, 1994
INVENTOR(S) : MAEDA et al

It is certified that error appears in the above-indentified patent and that said Letters Patent is hereby corrected as shown below:

Col. 4, line 20, "pies" should read --pipes--.

Col. 6, line 11, "pies" should read --pipes--; and line 50, "pies" should read --pipes--.

Col. 7, line 9, after "connected" insert --to--.

Signed and Sealed this

Thirteenth Day of September, 1994

Attest:

BRUCE LEHMAN

Attesting Officer    Commissioner of Patents and Trademarks